(12) United States Patent
Kim et al.

(10) Patent No.: US 11,149,346 B2
(45) Date of Patent: Oct. 19, 2021

(54) METHOD OF DIRECTLY GROWING CARBON MATERIAL ON SUBSTRATE

(71) Applicant: Samsung Electronics Co., Ltd., Suwon-si (KR)

(72) Inventors: Changhyun Kim, Seoul (KR); Hyeonjin Shin, Suwon-si (KR); Kyung-Eun Byun, Seongnam-si (KR); Keunwook Shin, Yongin-si (KR); Changseok Lee, Seoul (KR); Seunggeol Nam, Suwon-si (KR); Sungjoo An, Seongnam-si (KR); Janghee Lee, Yongin-si (KR); Jeonil Lee, Suwon-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 16/244,906

(22) Filed: Jan. 10, 2019

(65) Prior Publication Data

US 2020/0032388 A1 Jan. 30, 2020

(30) Foreign Application Priority Data

Jul. 25, 2018 (KR) .......................... 10-2018-0086770

(51) Int. Cl.
*C23C 16/26* (2006.01)
*C01B 32/186* (2017.01)
(Continued)

(52) U.S. Cl.
CPC ............ *C23C 16/26* (2013.01); *C01B 32/186* (2017.08); *C23C 14/021* (2013.01); *C23C 14/0605* (2013.01); *C23C 16/56* (2013.01)

(58) Field of Classification Search
CPC ... C23C 14/065; C23C 14/5826; C23C 16/26; C23C 16/4401; C23C 16/4408;
(Continued)

(56) References Cited

U.S. PATENT DOCUMENTS 7,988,941 B2 * 8/2011 Choi .................. C01B 32/186
423/448
8,476,765 B2 7/2013 Zhang et al.
(Continued)

FOREIGN PATENT DOCUMENTS

CN 103572247 A 2/2014
CN 103121670 B 4/2015
(Continued)

OTHER PUBLICATIONS

Richard J. Lewis, Sr., editor; Hawley's Condensed Chemical Dictionary; 12th edition; Van Nostrand Reinhold Company, New York; 1993 (no month); pp. 3, 25, 254 & 994-995.*
(Continued)

*Primary Examiner* — Bret P Chen
(74) *Attorney, Agent, or Firm* — Harness, Dickey & Pierce, P.L.C.

(57) ABSTRACT

Provided are methods of directly growing a carbon material. The method may include a first operation and a second operation. The first operation may include adsorbing carbons onto a substrate by supplying the carbons to the substrate. The second operation may include removing unreacted carbon residues from the substrate after suspending the supplying the carbons of the first operation. The two operations may be repeated until a desired graphene is formed on the substrate. The substrate may be maintained at a temperature less than 700° C. In another embodiment, the method may include forming a carbon layer on a substrate, removing carbons that are not directly adsorbed to the
(Continued)

substrate on the carbon layer, and repeating the two operations until desired graphene is formed on the substrate. The forming of the carbon layer includes supplying individual carbons onto the substrate by preparing the individual carbons.

23 Claims, 6 Drawing Sheets

(51) Int. Cl.
  *C23C 14/02* (2006.01)
  *C23C 16/56* (2006.01)
  *C23C 14/06* (2006.01)
(58) Field of Classification Search
  CPC ..... C23C 16/45536–45542; C23C 16/50–517;
   C23C 16/56; C23C 16/45525; C01B
   32/182–188; C01B 32/194; C01B 32/196
  USPC ....... 427/525, 530, 528, 534, 562, 575, 577,
   427/249.1, 249.6; 204/192.15–192.17,
   204/192.3
  See application file for complete search history.

(56) References Cited

U.S. PATENT DOCUMENTS

| | | | |
|---|---|---|---|
| 8,808,810 B2 * | 8/2014 | Veerasamy | B82Y 40/00 427/508 |
| 9,306,005 B2 | 4/2016 | Byun et al. | |
| 9,371,234 B2 | 6/2016 | Hong et al. | |
| 9,472,450 B2 | 10/2016 | Bonilla et al. | |
| 9,543,156 B1 | 1/2017 | Hu | |
| 10,738,377 B2 * | 8/2020 | Matsumoto | C23C 14/5833 |
| 2004/0253167 A1 | 12/2004 | Silva et al. | |
| 2007/0082488 A1 | 4/2007 | Katou | |
| 2011/0117328 A1 | 5/2011 | Ivanov | |
| 2011/0143045 A1 * | 6/2011 | Veerasamy | B82Y 30/00 427/495 |
| 2012/0021249 A1 * | 1/2012 | Shin | B82Y 40/00 428/688 |
| 2012/0138903 A1 | 6/2012 | Chung et al. | |
| 2012/0139114 A1 | 6/2012 | Zhang et al. | |
| 2012/0141799 A1 | 6/2012 | Kub et al. | |
| 2012/0147147 A1 | 6/2012 | Park et al. | |
| 2012/0261644 A1 * | 10/2012 | Dimitrakopoulos | B82Y 30/00 257/29 |
| 2013/0001515 A1 * | 1/2013 | Li | C01B 32/184 257/24 |
| 2013/0130011 A1 | 5/2013 | Hong et al. | |
| 2013/0187097 A1 | 7/2013 | Hong et al. | |
| 2013/0192461 A1 * | 8/2013 | Miller | B01D 71/021 95/47 |
| 2013/0299988 A1 | 11/2013 | Bonilla et al. | |
| 2013/0321584 A1 | 12/2013 | Choi | |
| 2014/0145332 A1 | 5/2014 | Ryan et al. | |
| 2014/0272195 A1 * | 9/2014 | McAlister | C23C 16/0263 427/585 |
| 2014/0353722 A1 | 12/2014 | Zhang et al. | |
| 2015/0013593 A1 * | 1/2015 | Dong | C30B 29/02 117/88 |
| 2015/0091175 A1 | 4/2015 | Chandhok et al. | |
| 2015/0235847 A1 * | 8/2015 | Beasley | C01B 32/186 427/535 |
| 2015/0235959 A1 | 8/2015 | Lee et al. | |
| 2016/0064489 A1 * | 3/2016 | Zhang | H01L 21/0259 257/26 |
| 2016/0068397 A1 * | 3/2016 | Su | C23C 16/26 427/577 |
| 2016/0075560 A1 * | 3/2016 | Kagaya | C23C 16/26 427/569 |
| 2016/0240482 A1 | 8/2016 | Song et al. | |
| 2016/0270237 A1 | 9/2016 | Cho et al. | |
| 2016/0339160 A1 | 11/2016 | Bedworth et al. | |
| 2016/0365585 A1 * | 12/2016 | Kamepalli | C23C 16/50 |
| 2017/0033003 A1 | 2/2017 | Song et al. | |
| 2017/0125320 A1 * | 5/2017 | Sung | H01L 21/02595 |
| 2017/0152146 A1 * | 6/2017 | Kim | B01J 19/247 |
| 2017/0154701 A1 | 6/2017 | Lee et al. | |
| 2017/0221996 A1 * | 8/2017 | Park | H01L 29/778 |
| 2018/0057933 A1 | 3/2018 | Ifuku et al. | |
| 2018/0149966 A1 | 5/2018 | Shin et al. | |
| 2018/0187298 A1 * | 7/2018 | Matsumoto | C23C 14/024 |
| 2019/0096801 A1 | 3/2019 | Yang et al. | |
| 2019/0108948 A1 | 4/2019 | Chai et al. | |
| 2019/0144283 A1 | 5/2019 | Jakobsen et al. | |
| 2019/0161351 A1 * | 5/2019 | Song | H01L 21/28525 |
| 2019/0285548 A1 * | 9/2019 | Nunney | G01J 3/40 |
| 2019/0345610 A1 * | 11/2019 | Song | C23C 16/45525 |
| 2020/0039827 A1 * | 2/2020 | Jung | H01L 21/02527 |
| 2020/0071233 A1 | 3/2020 | Joo et al. | |
| 2020/0105524 A1 * | 4/2020 | Shin | H01L 21/02527 |
| 2020/0140279 A1 * | 5/2020 | Shin | C01B 32/186 |
| 2020/0286732 A1 * | 9/2020 | Shin | C23C 16/26 |
| 2020/0350164 A1 * | 11/2020 | Lee | H01L 29/165 |
| 2020/0354829 A1 * | 11/2020 | Song | C23C 16/26 |

FOREIGN PATENT DOCUMENTS

| | | |
|---|---|---|
| CN | 105585011 A | 5/2016 |
| JP | 2013249530 A | 12/2013 |
| JP | 2014170826 A | 9/2014 |
| KR | 20120012271 A | 2/2012 |
| KR | 20120059853 A | 6/2012 |
| KR | 101312454 B1 | 9/2013 |
| KR | 101313746 B1 | 10/2013 |
| KR | 101381008 B1 | 4/2014 |
| KR | 101493893 B1 | 2/2015 |
| KR | 20150012251 A | 2/2015 |
| KR | 20150098180 A | 8/2015 |
| KR | 20150121680 A | 10/2015 |
| KR | 20160085418 A | 7/2016 |
| KR | 20160112245 A | 9/2016 |
| KR | 20180025819 A | 3/2018 |
| WO | WO-2015022500 A1 | 2/2015 |
| WO | WO-2015149116 A1 | 10/2015 |

OTHER PUBLICATIONS

Machine translation (WIPO) of CN 103121670 A, By Ren Wei et al.; published May 29, 2013.*
Machine translation CN 103572247 A via ESpaceNet, by inventors Lui LiWei et al., published Feb. 12, 2014, plus figures missing from Chinese document supplied in previous Jan. 10, 2019 PTO-1449.*
"Allotropes of Carbon", Introduction to Chemistry: nonmetallic elements; 10 pages; retrieved from Internet Jan. 14, 2021 from ://courses.lumenlearning.com/introchem/chapter/allotropes-of-carbon/#:~: text = there are several allotropes of walled carbon nanotubes%2C or b . . . .*
"6.3 Forms of Crystalline Carbon"; flex books 2.0, CK-12 Physical Science for Middle School; 7 pages; last modified Jul. 3, 2019, retrieved from Internet Jan. 14, 2021 from ://flexbooks.CK12.org/cbook/CK-12-middle-school-physical-science-flex book-2.0/section/6.3/primary/lesson/crystalline-carbon-ms-ps.*
Wang, Guizhen, et al., "High densities of magnetic nanoparticles supported on graphene fabricated by atomic layer deposition and their use as efficient synergistic microwave absorbers". Nano Research 2014, 7(5): 704-716 DOI 10.1007/s12274-014-0432-0.*
Zhang, Yijun, et al., "Low-Temperature Remote Plasma-Enhanced Atomic Layer Deposition of Graphene and Characterization of Its Atomic-Level Structure". Journal of Materials Chemistry C, 2014, 2, 7570-7574.*
Extended European Search report dated Dec. 20, 2019, issued in corresponding European Patent Application No. 19171635.6.
Extended European Search Report dated Jul. 31, 2019, issued in corresponding European Patent Application No. 18212973.4.
Extended European Search report dated Aug. 7, 2019, issued in corresponding European Patent Application No. 18206535.9.

(56) References Cited

OTHER PUBLICATIONS

Y. Wang et al., 'Toward High Throughput Interconvertible Graphene-to-Graphene Growth and Patterning', *ACS Nano*, vol. 4, No. 10, 2010, pp. 6146-6152.
Z. Luo et al., 'Thickness-Dependent Reversible Hydrogenation of Graphene Layers'. *ACS Nano*, vol. 3, No. 7, 2009, pp. 1781-1788.
L. Pedrazzetti et al., 'Growth and characterization of ultrathin carbon films on electrodeposited Cu and Ni'. *Surface and Interface Analysis*, vol. 49, 2017, pp. 1088-1094.
Yong Seung Kim, Direct Integration of Polycrystalline Graphene into Light Emitting Diodes by Plasma-Assisted Metal-Catalyst-Free Synthesis, ACS nano, vol. 8, No. 3, 2230-2236, 2014.
European Search Report dated Mar. 29, 2019, issued in corresponding European Patent Application No. 18206535.9.
Wang et al., "Synthesis of graphen on a polycrystalline Co film by radio-frequency plasma-enhanced chemical vapour deposition" J.Phys. D:Appl.Phys. 43 (2010) 455402, (6 pages).
Liu et al., "Two-step growth of graphene with separate controlling nucleation and edge growth directly on $SiO_2$ substrates" Carbon 72 (2014) pp. 387-392.
Kim et al., "Direct growth of patterned graphene on $SiO_2$ substrates without the use of catalysts or lithography" Nanoscale (2014) 6, pp. 10100-10105.
"Graphene", Scientific Background on the Nobel Prize in Physics 2010, compiled by the Class for Physics of the Royal Swedish Academy of Sciences, Oct. 5, 2010.
U.S. Appl. No. 16/183,146.
U.S. Appl. No. 16/215,899.
Office Action dated Nov. 3, 2020, recieved in corresponding U.S. Appl. No. 16/884,590.
Notice of Preliminary Examination Result dated Mar. 20, 2018, issued in corresponding Korean Patent Application No. KR 10-2017-0161833.
Menglin Li et al., 'Controllable Synthesis of Graphene by Plasma-Enhanced Chemical Vapor Deposition and Its Related Applications' *Advanced Science* 2016, 3, 1600003.
Office Action dated Jul. 10, 2020, received in corresponding U.S. Appl. No. 16/884,590.
Office Action dated Dec. 22, 2020, received in corresponding U.S. Appl. No. 16/183,146.
Office Action dated Dec. 24, 2020, received in corresponding U.S. Appl. No. 16/260,403.
Office Action dated Sep. 21, 2020, received in corresponding U.S. Appl. No. 16/215,899.
Notice of Allowance dated Dec. 9, 2020, received in corresponding U.S. Appl. No. 16/215,899.
Notice of Allowance dated Apr. 9, 2021, received in corresponding U.S. Appl. No. 16/260,403.
Office Action dated Apr. 14, 2021, received in corresponding U.S. Appl. No. 16/884,590.
Office Action from the Korean Patent Office dated Jun. 11, 2018 for KR Appl. No. 10-2017-0161833.
U.S. Appl. No. 16/183,146, filed Nov. 7, 2018.
Notice of Allowance dated Jul. 21, 2021, received in corresponding U.S. Appl. No. 16/183,146.

* cited by examiner

METHOD OF DIRECTLY GROWING CARBON MATERIAL ON SUBSTRATE

CROSS-REFERENCE TO RELATED APPLICATION

This application claims the benefit of Korean Patent Application No. 10-2018-0086770, filed on Jul. 25, 2018, in the Korean Intellectual Property Office, the disclosure of which is incorporated herein in its entirety by reference.

BACKGROUND

1. Field

The present disclosure relates to methods of forming a material on a substrate, and more particularly, to methods of directly growing a carbon material on a substrate.

2. Description of the Related Art

Carbon materials, such as carbon nanotube or graphene, may be formed by various methods well known in the art. Due to high physical, electrical and optical characteristics of graphene, the usages of graphene are gradually increasing.

Currently, well-known methods of forming graphene may include a method of transferring graphene to a location after growing the graphene in another location.

SUMMARY

Provided are methods of directly growing a carbon material for obtaining high quality graphene directly grown on a non-metal substrate at a relatively lower temperature than in the related art.

Additional aspects will be set forth in part in the description which follows and, in part, will be apparent from the description, or may be learned by practice of the presented embodiments.

According to an aspect of an embodiment, a method of directly growing a carbon material includes performing a first operation and performing a second operation. The performing the first operation includes adsorbing carbons onto a substrate by supplying the carbons to the substrate. The performing the second operation includes removing unreacted carbon residues from the substrate after suspending the supplying the carbons of the first operation.

In some example embodiments, the first operation and the second operation may be repeated until a desired graphene is formed on the substrate, and an amount of carbons supplied in the repeated first operation and second operation may be equal to or different from the amount of carbons supplied in the first operation.

In some example embodiments, the adsorbing of the carbons onto the substrate during the performing the first operation by supplying carbons may include maintaining the substrate at a temperature less than 700° C., preparing a carbon source, and supplying the carbons onto the substrate by separating the carbons included in the carbon source.

In some example embodiments, the maintaining the substrate may include maintaining the temperature of the substrate in a range of about 200° C. to about 700° C. during the performing the first operation.

In some example embodiments, the carbon source may include at least one of an aliphatic carbon material or an aromatic carbon material.

In some example embodiments, the separating the carbons included in the carbon source may include irradiating plasma to the carbon source to separate the carbons.

In some example embodiments, the method may further include performing a process to remove secondary materials in response to the secondary materials that are not carbons being attached to the carbons directly adsorbed onto the substrate.

In some example embodiments, the unreacted carbon residues may include carbons or carbon lumps that are not directly adsorbed onto the substrate and the unreacted carbon residues may be adsorbed on the carbons that are directly adsorbed onto the substrate, of the carbons supplied onto the substrate.

In some example embodiments, the removing the unreacted carbon residues may include performing a plasma process on the carbons present on the substrate, and a plasma energy in the plasma process may be less than an adsorption energy between the substrate and the carbons directly adsorbed onto the substrate.

In some example embodiments, the substrate includes a non-metal substrate or a metal substrate. The non-metal substrate may include Si, Ge, or a dielectric material.

In some example embodiments, the removing the unreacted carbon residues during the performing the second operation may include performing a first sub-operation that includes supplying a purging gas to the substrate and performing a second sub-operation that includes evacuating a gas including the unreacted carbon residues. The first sub-operation and the second sub-operation may be sequentially and repeatedly performed.

In some example embodiments, the first sub-operation and the second sub-operation may be performed under different pressure conditions from each other. A pressure condition at one repetition may be different from a pressure condition at another repetition.

According to an aspect of another embodiment, a method of directly growing a carbon material includes: performing a first operation that includes forming a carbon layer on a substrate; performing a second operation that includes removing carbons that are not directly adsorbed onto the substrate from the carbon layer; and repeating the first operation and the second operation until a desired graphene is formed on the substrate.

In some example embodiments, the first operation may include supplying individual carbons onto the substrate by preparing the individual carbons. The individual carbons may be formed by plasma processing a carbon source.

In some example embodiments, the carbon source may include at least one of an aliphatic carbon material or an aromatic carbon material.

In some example embodiments, the substrate may include a non-metal substrate.

In some example embodiments, the first operation and the second operation may be performed in a chamber and the chamber may be maintained at a pressure that less than atmospheric pressure.

In some example embodiments, the substrate may be maintained at a temperature in a range of about 200° C. to about 700° C. during the performing the first operation and the performing the second operation.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
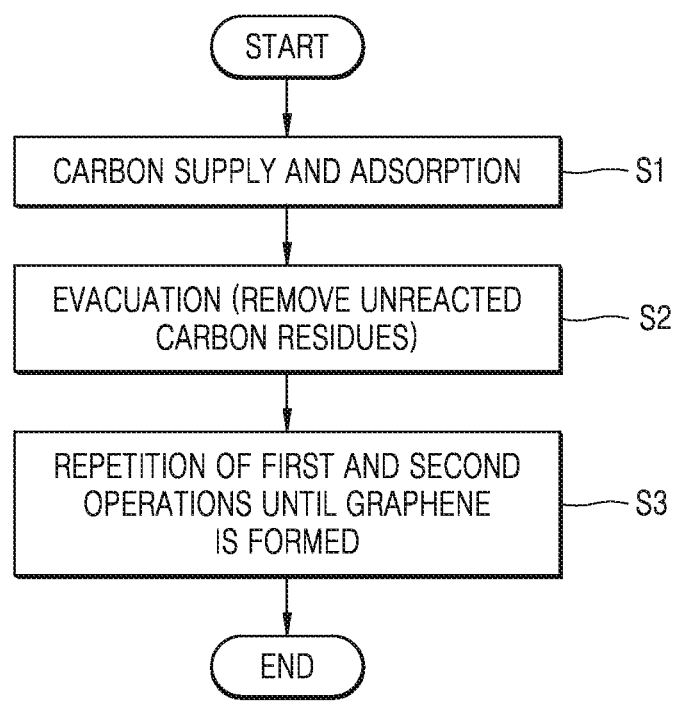
FIG. 1 is a flowchart of a method of directly growing a carbon material according to an embodiment.

Graphene may be grown in a way that, after growing graphene by using a chemical vapor deposition (CVD) method, the graphene may be transferred onto a desired substrate. However, this method may be inefficient to be applied to a semiconductor process.

Instead of the transfer method, a method of directly growing graphene on an existing substrate may be efficient. However, it is difficult to obtain high quality graphene in the method of directly growing graphene according to the related art due to limitations in a low process temperature (for example, 700° C. or less) and a non-metal substrate.

The crystallinity of graphene affects electrical characteristics, such as the conductivity of graphene and a barrier characteristic of the graphene. Therefore, in order to obtain high quality graphene, it is necessary to ensure the high crystallinity of graphene.

A method of ensuring the crystallinity of graphene is disclosed herein. In a method disclosed herein, a carbon source used for growing graphene may not be supplied once, but be supplied a few times by dividing the carbon source, and evacuation processes may be performed in between the carbon source supplies.

Hereinafter, a method of directly growing a carbon material according to an embodiment will now be described in detail with reference to the accompanying drawings. In the drawings, thicknesses of layers or regions may be exaggerated for the clarity of the specification. Operation methods may be described together with the description of modules.

The method of directly growing a carbon material according to an embodiment is a method of obtaining high quality graphene by increasing crystallinity of the graphene by repeating a plurality of operations until the graphene is completely formed.

FIG. 1 is a flowchart of a method of directly growing a carbon material according to an embodiment.

Referring to FIG. 1, the method of directly growing a carbon material according to an embodiment may include first through third operations S1 through S3. The first operation S1 is attaching carbons onto a substrate by supplying a carbon source on the substrate. The second operation S2 is the evacuation of unreacted carbons, that is, carbons that are not attached to the substrate and defective carbon lumps are evacuated (removed). In the third operation S3, the first and second operations S1 and S2 are repeated for a specified number of times until the graphene is formed.

The first operation S1 may be a carbon supply and attaching operation. In the first operation S1, the substrate on which the graphene is to be formed is maintained at a given temperature. The substrate may be maintained at a temperature in a range from 200° C. to 700° C., for example, may be maintained at a temperature of about 400° C. The temperature range described above may be relatively low compared to a graphene growing temperature (for example, 1000° C.) in the related art.

In the first operation S1, a portion of an amount of total carbon to be supplied may be supplied ahead, and the remaining portion may be sequentially supplied in repeating operations. An amount of carbons to be supplied in the repeating operations may be equal to or different from the amount of carbon supplied in the first operation S1.

Figure 3:
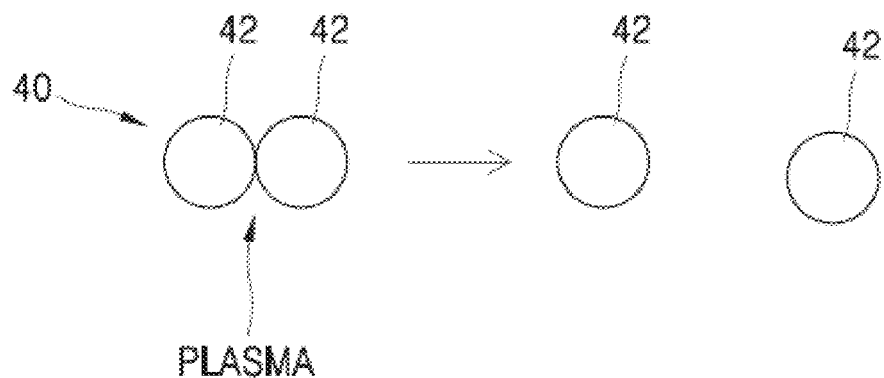
FIG. 3 is a schematic diagram of a process of separating a carbon source to individual carbons by irradiating plasma to the carbon source in a method of directly growing a carbon material according to an embodiment.

In the first operation S1, the carbon supply may be performed as follows. First, a carbon source is prepared. The carbon source may include a material containing carbon. The carbon source may be, for example, a material including $CH_4$ or $C_2H_2$. For example, the carbon source may be an aliphatic carbon material or an aromatic carbon material including $CH_4$ or $C_2H_2$. In some other embodiments, the carbon source may include both the aliphatic carbon material and the aromatic carbon material. When the carbon source is supplied onto the substrate, the carbon source is separated into individual carbons. In order to separate the carbon source into the individual carbons, as depicted in FIG. 3, plasma may be irradiated to a carbon source 40. The carbon source 40 may include a plurality of carbons C1 and C2. The carbon source 40 is an example for explanation, and thus, is not limited thereto. The carbon source 40 may include the aliphatic carbon material or the aromatic carbon material. The plasma may use at least one of $H_2$, Ar, and $N_2$ as a plasma source. Energy of plasma may be controlled according to the kind of carbon source 40. As a result of the plasma process, a plurality of carbons 42 included in the carbon source 40 are separated and supplied onto the substrate. When the carbon source 40 is an aromatic carbon material, the plasma irradiation may be performed to remove materials (for example, hydrogen) attached to a ring like branches while maintaining the hexagonal ring of the aromatic carbon material instead of separating the carbons of the carbon source 40 into individual carbons. The intensity of plasma energy may be changed considering the state of each of the carbon sources.

A secondary material (for example, hydrogen) may be attached to carbons individually separated by the plasma process. After the carbons individually separated are adsorbed to the substrate, the carbons adsorbed to the substrate may be exposed to plasma to remove the secondary material attached to the carbons. The intensity of plasma energy at this moment may be different from plasma energy irradiated to the carbon source 40.

Figure 4:
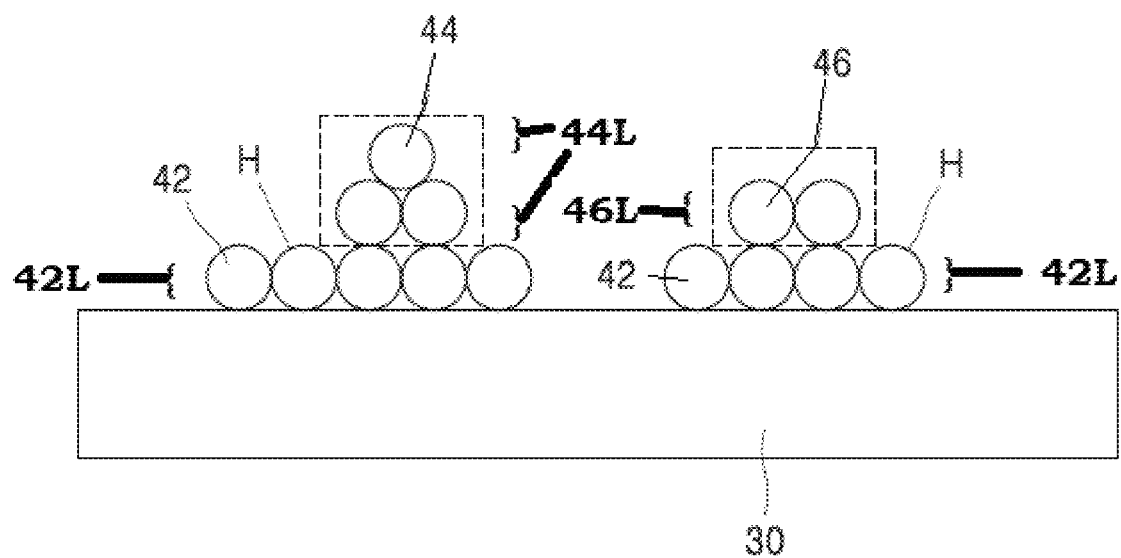
FIG. 4 is a cross-sectional view showing a case in which unreacted carbon residues are on a substrate in a method of directly growing a carbon material according to an embodiment.

The carbons 42 separated from the carbon source 40, as depicted in FIG. 4, are adsorbed to the substrate 30 by being supplied to the substrate 30. Some of the carbons 42 supplied onto the substrate 30 may be attached to the carbons 42 adsorbed to the substrate 30. Carbons 44 and 46 that are not directly adsorbed to the substrate 30 but are attached to the carbons 42 adsorbed to the substrate 30 are referred to as unreacted carbon residues 44 and 46. The substrate 30 may include a non-metal substrate, but is not limited thereto. When necessary, a metal substrate may be used as the substrate 30. When the substrate 30 is a non-metal substrate, the substrate 30 may be a silicon substrate, a germanium substrate, or a dielectric substrate. When the substrate 30 is a metal substrate, the substrate 30 may be, for example, a copper substrate.

Also, in the first operation S1, some of the carbons 42 may react with each other before reaching the substrate 30 in a process of supplying them onto the substrate 30. As a result, carbon lumps may be formed. The carbon lumps may act as a graphene defect by falling on the substrate 30 or on the carbons adsorbed to the substrate 30. The carbon lumps may be referred to as unreacted carbon residues in a sense that the carbon lumps do not contribute to the growth of graphene.

While the second operation S2, which is an evacuation operation, is performed, the carbon supply may be suspended. In the second operation S2, the unreacted carbon residues 44 and 46 are removed. As an example, the second operation S2 may be performed at once without suspension.

Figure 2:
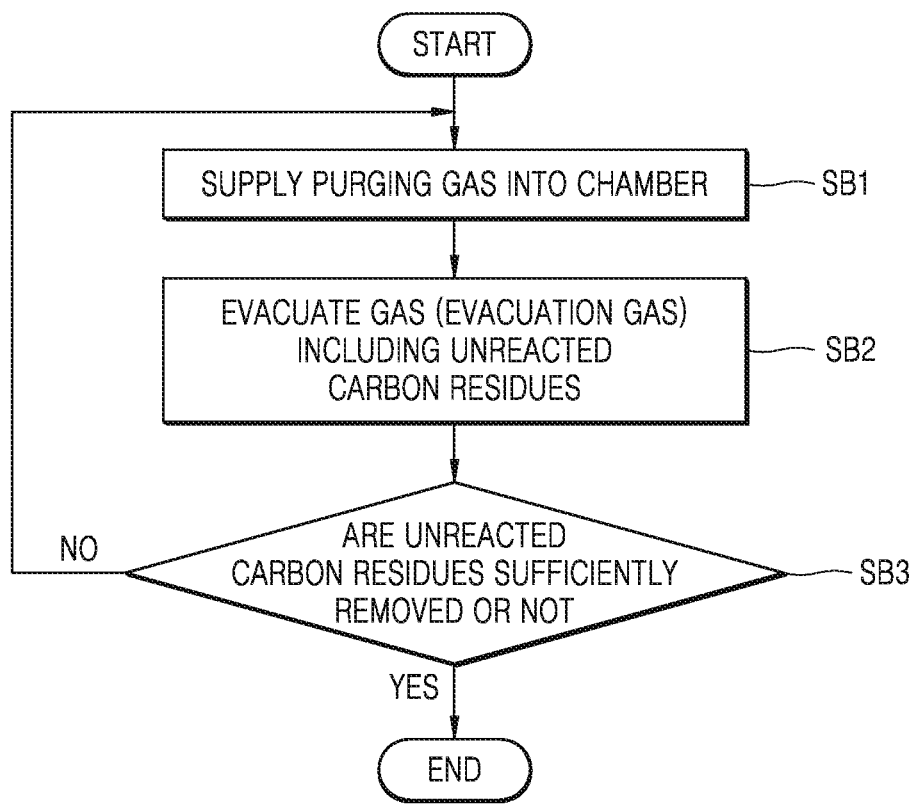
FIG. 2 is a flowchart of the second operation of FIG. 1.

In another embodiment, as depicted in FIG. 2, the second operation S2 may be divided into a plurality of operations. FIG. 2 is a flowchart of a case in which the second operation S2 is divided into a plurality of operations.

Also, when the second operation S2 is divided into a plurality of operations, each of the plurality of operations may be consecutively performed. For example, the second operation S2 may be divided into a first sub-operation SB1 in which a purging gas is supplied into a chamber in order to detach the unreacted carbon residues 44 and 46 from the carbons 42 that are adsorbed to the substrate 30 and a second sub-operation SB2 in which a gas, that is, a discharge gas including the unreacted carbon residues 44 and 46 that are detached from the carbons 42 adsorbed to the substrate 30 by performing the first sub-operation SB1, is evacuated.

In the first sub-operation SB1, a supply pressure of the purging gas supplying into the chamber may be increased. At this point, the supply pressure may be appropriately controlled considering the amount of the unreacted carbon residues 44 and 46. The purging gas supplied into the chamber in the first sub-operation SB1 may include, for example, at least one of $N_2$, Ar, $H_2$, and $O_2$. The second sub-operation SB2 may be performed at a different pressure from the first sub-operation SB1. For example, the second sub-operation SB2 may be performed at a pressure lower than that of the first sub-operation SB1. That is, the evacuation pressure of the purging gas in which the unreacted carbon residues 44 and 46 are mixed may be lower than the supply pressure of the purging gas.

In the second operation S2, the first sub-operation SB1 and the second sub-operation SB2 may be sequentially repeatedly performed. That is, after the first sub-operation SB1 and the second sub-operation SB2 are performed, in a third sub-operation SB3, whether the unreacted carbon residues 44 and 46 are sufficiently removed or not is determined. When it is determined that the unreacted carbon residues 44 and 46 are sufficiently removed and/or evacuated (Yes), the second sub-operation SB2 may be terminated. Otherwise, when it is determined that the unreacted carbon residues 44 and 46 are not sufficiently removed (No) in the third sub-operation SB3, the first sub-operation SB1 and the second sub-operation SB2 are sequentially repeated.

As an example, assuming that a total time for performing the second operation S2 is 60 seconds, the first sub-operation SB1 and the second sub-operation SB2 may be performed once in 20 seconds. In this manner, the first sub-operation SB1 and the second sub-operation SB2 may be sequentially performed three times in the second operation S2.

While the first sub-operation SB1 and the second sub-operation SB2 are sequentially repeated, the repeating times may be different. That is, a second repeating time may be greater or less than a first repeating time, and a third repeating time may be different from the second repeating time.

Also, while the first sub-operation SB1 and the second sub-operation SB2 are repeatedly performed, a pressure in the chamber may be controlled. For example, the pressure of the first sub-operation SB1 or the first sub-operation SB1 and the second sub-operation SB2 in the second repeating time may be equal to or different from the pressure of the first sub-operation SB1 or the first sub-operation SB1 and the second sub-operation SB2 in the first time.

Plasma may be used as one of the methods of removing the unreacted carbon residues 44 and 46. The removal of the unreacted carbon residues 44 and 46 by using the plasma may use an adsorption energy difference between adsorption energy between the carbons 42 directly grown on the substrate 30, that is, the carbons 42 directly adsorbed onto the substrate 30 and the substrate 30 and adsorption energy between the carbons 42 adsorbed onto the substrate 30 and the unreacted carbon residues 44 and 46.

In detail, after the first operation S1 is completed, carbon layers 42 L+44 L and 42 L+46 L are formed on the substrate 30. The carbon layers 42 L+44 L and 42 L+46 L include the carbons 42 directly adsorbed onto the substrate 30 and the unreacted carbon residues 44 and 46 attached onto the carbons 42. In the case of the carbons 42 directly adsorbed onto the substrate 30, the carbons 42 and the substrate 30 are adsorbed with first adsorption energy. The first adsorption energy may be referred to as bonding energy between the carbons 42 and the substrate 30. In a layer structure in which carbons are attached to the carbons 42, that is, the unreacted carbon residues 44 and 46 are present on the carbons 42, the carbons 42 and the unreacted carbon residues 44 and 46 are adsorbed with second adsorption energy. The second adsorption energy may be less than the first adsorption energy. By using this characteristic, the carbon layers 42 L+44 L and 42 L+46 L formed on the substrate 30 may be processed by using plasma in the second operation S2. The plasma process may be irradiation of plasma to the carbon layers 42 L+44 L and 42 L+46 L formed on the substrate 30 or exposure of the carbon layers 42 L+44 L and 42 L+46 L to plasma. The plasma process may have selectivity due to the energy difference between the first and second adsorption energies. In this way, the carbon layers 42 L+44 L and 42 L+46 L attached onto the carbons 42 may be selectively removed. In the plasma process, the plasma energy with respect to the carbon layers 42 L+44 L and 42 L+46 L in the plasma process may be determined as less than the first adsorption energy and greater than the second adsorption energy. Through setting the plasma energy in this manner, only the unreacted carbon residues 44 and 46 may be selectively removed. In the second operation S2, the plasma may include at least one of $H_2$, Ar, and $N_2$ as a plasma source. In the plasma process for removing the unreacted carbon residues 44 and 46, a secondary material (for example, hydrogen) attached to the carbons 42 directly adsorbed onto the substrate 30 may also be removed from the carbons 42. An additional plasma process for removing the secondary material attached to the carbons 42 may also be performed.

The first and second operations S1 and S2 may be performed in a chamber (not shown) in which the substrate 30 is loaded. The unreacted carbon residues 44 and 46 removed in the second operation S2 may be evacuated to the outside by supplying an exhaust gas into the chamber. The inner pressure of the chamber in the second operation S2 may be less than atmospheric pressure. As an example, the inner pressure of the chamber may be maintained at a pressure close to a vacuum.

In the second operation S2, the movement or diffusion of the carbons 42 directly adsorbed onto the substrate 30 in a lateral direction may occur together with the removal of the unreacted carbon residues 44 and 46.

Figure 5:
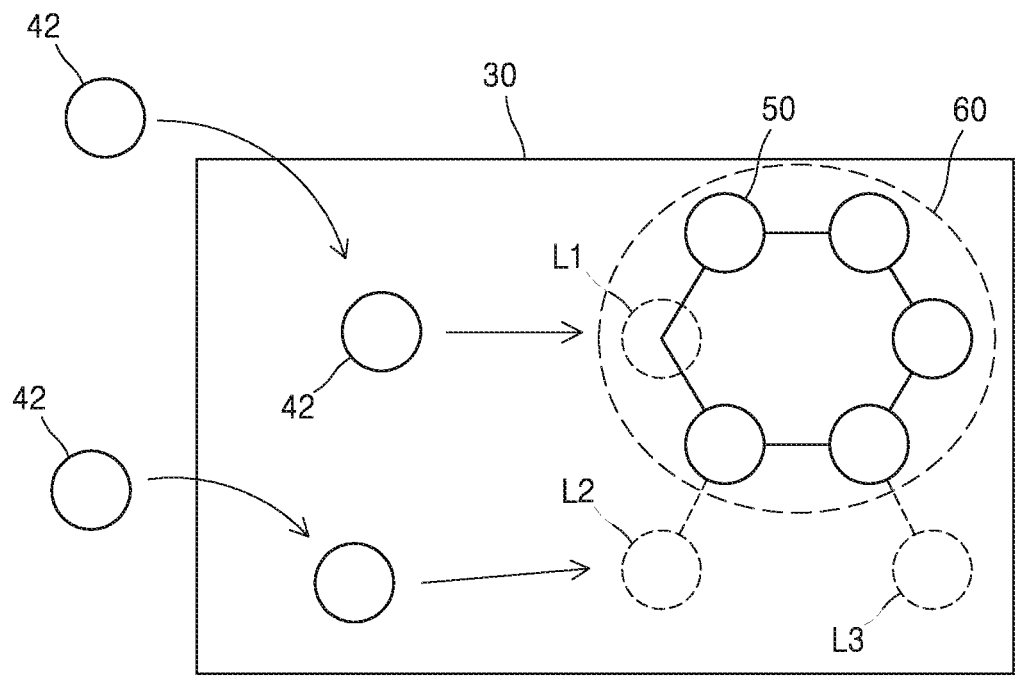
FIG. 5 is a plan view showing a case in which carbons supplied onto a substrate are moved to a stable location in an evacuation operation to form a graphene crystal in a method of directly growing a carbon material.

FIG. 5 is a schematic diagram showing the movement of the carbons 42. The movement of the carbons 42 may be a process of finding energetically stable locations of the carbons 42 directly adsorbed onto the substrate 30 in the second operation S2. As an example, when carbons 50 already adsorbed onto the substrate 30 are in a process of forming a unit graphene 60 having a hexagonal shape and at least one location L1 of the unit graphene 60 is vacant, the carbon 42 just adsorbed onto the substrate 30 may move to the last one vacant and stable location L1 while the second operation S2 is performed. Afterwards, other carbons 42 adsorbed onto the substrate 30 may move to a stable second location L2 or a third location L3 near the unit graphene 60.

Accordingly, a completion time of the second operation S2 may be set considering a time in which the movement of the carbons 42 adsorbed onto the substrate 30 is completed. As an example, the time when the second operation S2 is completed may be set greater than an average time of the movement of the carbons 42 or greater than a maximum time of the movement of the carbons 42.

In the third operation S3, the first and second operations S1 and S2 are repeated. After the second operation S2 is completed, the degree of growth of graphene is determined. When the graphene is not completely grown to the degree of set value, the operations are repeated from the first operation S1. The number of repetitions of the first operation S1 and the second operation S2 may be appropriately determined according to the growth of graphene. Also, the number of repetitions may be set prior to the process start. At this point, in the course of observing the growth of graphene, when the graphene is grown earlier than expected, the process may be suspended before reaching the number of repetitions set ahead.

Figure 6:
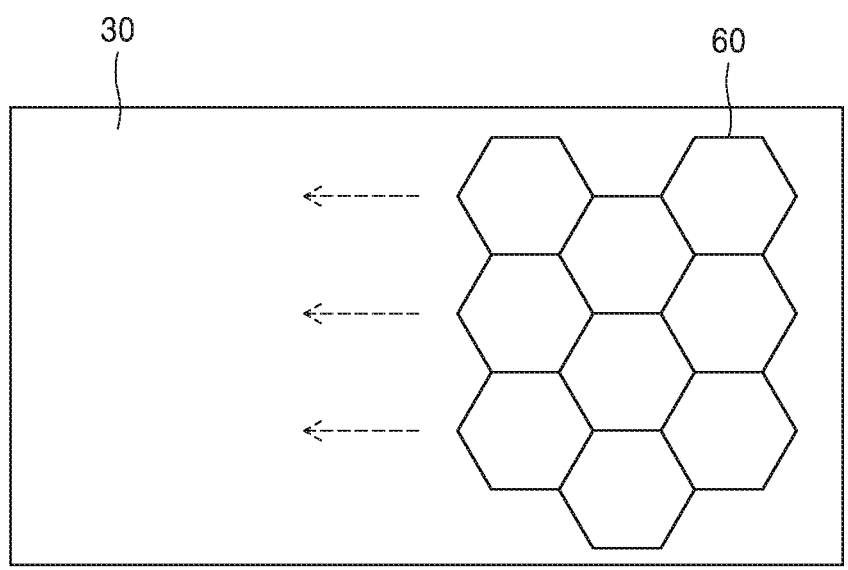
FIG. 6 is a plan view showing a case in which graphene grows in a lateral direction on a substrate as a result of the process of FIG. 5.

FIG. 6 shows the growth of graphene in the lateral direction. Through the repetition of the first operation S1 and the second operation S2, graphene may grow in a lateral direction on the substrate 30. The carbons 42 may move to energetically stable locations around the unit graphene 60 through the first operation S1 and the second operation S2, and as a result, the graphene may grow in the lateral direction of the unit graphene 60. During the repetition of the first operation S1 and the second operation S2, as described above, the unreacted carbon residues 44 and 46 are removed, that is, defect of graphene is removed, and thus, the crystallinity of the graphene grown on the substrate 30 may be much better than in the related art. That is, high quality graphene may be directly grown on a non-metal substrate of a low temperature.

Figure 7:
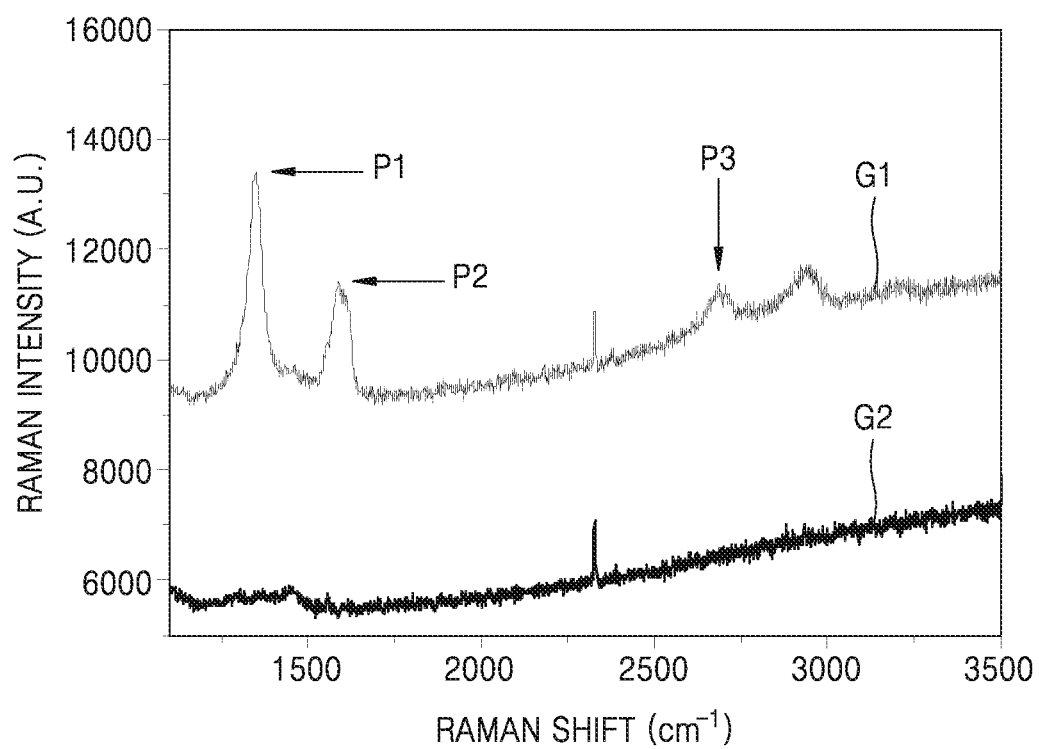
FIG. 7 is a graph showing the growth of graphene in a method of directly growing a carbon material according to an embodiment and in a method of directly growing graphene according to the related art, in the same conditions (for example, a low temperature or a non-metal substrate)

FIG. 7 is a graph showing the Raman intensities of carbon materials obtained by using the method of directly growing the carbon material according to an embodiment and a general method of directly growing a carbon material according to the related art. The two methods were performed at a temperature of 400° C. by using silicon substrates. In the general method of directly growing a carbon material of the related art, a carbon material is grown by continuously supplying carbons.

In FIG. 7, the horizontal axis indicates the Raman shift, and the vertical axis indicates the Raman intensity. A first graph G1 shows a measuring result of a carbon material, that is, graphene obtained by using the method of directly growing a carbon material according to an embodiment. A second graph G2 shows a measuring result of a carbon material obtained by using the general method of directly growing a carbon material according to the related art.

Referring to FIG. 7, first through third peaks P1 through P3 are clearly shown in the first graph G1. The first through third peaks P1 through P3 respectively indicate a D-band, a G-band, and a 2D-band, and the bands are characteristics of the graphene. That is, the first through third peaks P1 through P3 indicate that graphene may be grown on a non-metal substrate at a low temperature when the method of directly growing a carbon material according to an embodiment is used.

However, in the case of the second graph G2, peaks are not shown on locations of the second graph G2 corresponding to the first through third peaks P1 through P3 of the first graph G1. This result indicates that graphene is not included in the carbon material obtained by the general method of directly growing a carbon material according to the related art. Also, this result indicates that the general method of directly growing a carbon material according to the related art may not grow graphene on a non-metal substrate at a low temperature.

Figure 8:
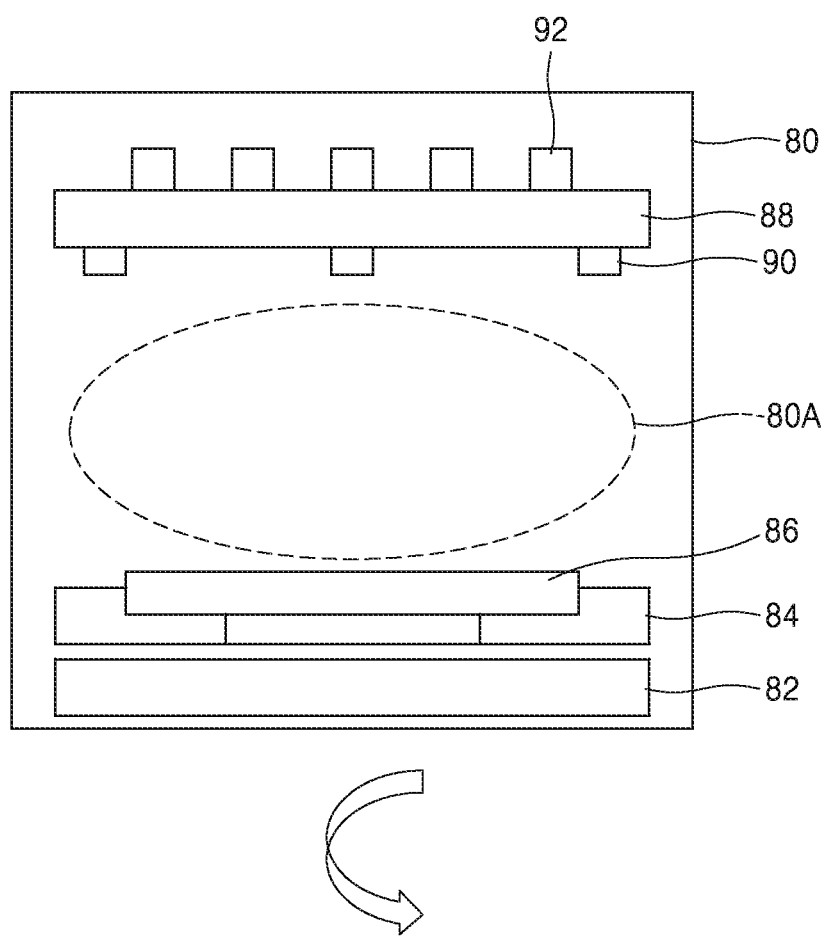
FIG. 8 is a cross-sectional view of an apparatus including a chamber for performing a method of directly growing a carbon material according to an example embodiment.

FIG. 8 is a cross-sectional view of an apparatus including a chamber for performing a method of directly growing a carbon material according to an example embodiment.

Referring to FIG. 8, the apparatus may include a chamber 80, a heater 82, a jig 84 for holding a substrate (e.g., wafer) 86, a ceramic plate 88, gas nozzles 90, and coils 92 to apply an electric power. The jig 84 may hold the substrate 86 and limit and/or prevent the substrate 86 from being contacted with the heater 82. A plasma generating space 80A may be provided in the chamber 80 between the jig 84 and ceramic plate 88.

In the method of directly growing a carbon material according to an embodiment, a carbon source is sequentially supplied, and unreacted carbon residues are removed from time to time. When graphene is grown in this method, graphene may be directly grown on a substrate even under conditions (a non-metal substrate and at a low temperature) in which directly growing of graphene according to the related art is difficult. In the evacuation process, the unreacted carbon residues and amorphous carbon carbons are removed, and thus, the crystallinity of graphene may be increased. Accordingly, when the method of directly growing a carbon material according to an embodiment is used, high quality graphene that may not be obtained by using a general method of directly growing graphene according to the related art may be obtained.

While one or more embodiments have been described with reference to the figures, it will be understood by those of ordinary skill in the art that various changes in form and details may be made therein without departing from the spirit and scope as defined by the following claims.

What is claimed is:

1. A method of directly growing a carbon material, the method comprising:
    performing a first operation that includes adsorbing carbons onto a substrate and forming an unreacted carbon residue over the substrate, the first operation including supplying supply carbons to the substrate such that a first portion of the supply carbons attach to the substrate to provide a plurality of adsorbed carbons on the substrate and a second portion of the supply carbons do not adsorb to the substrate and provide the unreacted carbon residue on the plurality of adsorbed carbons, the supplying the supply carbons including individually separating carbons from a carbon source to provide the supply carbons;

performing a second operation that includes removing the unreacted carbon residue from the substrate after suspending the supplying the supply carbons of the first operation; and repeating the first operation and the second operation each at least one time until a desired graphene is formed on the substrate.

2. The method of claim 1, wherein the desired graphene has Raman intensities indicating a D-band, G-band, and a 2D-band that are graphene characteristics in Raman spectra measurements.

3. The method of claim 1, wherein the adsorbing the carbons onto the substrate during the performing the first operation includes:

maintaining the substrate at a temperature less than 700° C.; and preparing the carbon source.

4. The method of claim 3, wherein the carbon source includes an aliphatic carbon material.

5. The method of claim 3, wherein the carbon source includes an aromatic carbon material.

6. The method of claim 3, wherein the separating the carbons from the carbon source to provide the supply carbons includes irradiating plasma to the carbon source to separate the carbons and provide the supply carbons.

7. The method of claim 3, further comprising:

performing a process to remove secondary materials from the plurality of adsorbed carbons without removing the plurality of adsorbed carbons, wherein the secondary materials are attached to the plurality of adsorbed carbons in the first operation, the performing the process to remove the secondary materials is performed after the performing the first operation, the secondary materials are not carbons, the plurality of adsorbed carbons are directly adsorbed onto the substrate.

8. The method of claim 1, wherein the adsorbing the carbons onto the substrate during the performing the first operation includes:

maintaining the substrate at a temperature in a range of about 200° C. to about 700° C. during the performing the first operation; and preparing the carbon source.

9. The method of claim 1, wherein the unreacted carbon residue includes a plurality of carbon lumps that are not directly adsorbed onto the substrate, and the unreacted carbon residue is adsorbed on the plurality of adsorbed carbons.

10. The method of claim 1, wherein the removing of the unreacted carbon residue includes performing a plasma process on the plurality of adsorbed carbons that are present on the substrate, and a plasma energy in the performing the plasma process is less than an adsorption energy between the substrate and the plurality of adsorbed carbons that are directly adsorbed onto the substrate.

11. The method of claim 1, wherein the substrate comprises a non-metal substrate.

12. The method of claim 11, wherein the non-metal substrate includes Si, Ge, or a dielectric material.

13. The method of claim 1, wherein the removing the unreacted carbon residue during the performing the second operation includes:

performing a first sub-operation that includes supplying a purging gas to the substrate; and performing a second sub-operation that includes evacuating a gas including the unreacted carbon residue.

14. The method of claim 13, wherein the first sub-operation and the second sub-operation are sequentially and repeatedly performed.

15. The method of claim 14, when the first sub-operation and the second sub-operation are repeatedly performed, and a pressure condition at one repetition is different from a pressure condition at another repetition.

16. The method of claim 13, wherein the first sub-operation and the second sub-operation are performed under different pressure conditions from each other.

17. A method of directly growing a carbon material, the method comprising:

performing a first operation that includes adsorbing carbons onto a substrate and forming an unreacted carbon residue on the substrate, the first operation including supplying supply carbons to the substrate such that a first portion of the supply carbons attach to the substrate to provide a plurality of adsorbed carbons on the substrate and a second portion of the supply carbons do not adsorb to the substrate and provide the unreacted carbon residue on the substrate, the supplying the supply carbons including individually separating carbons from a carbon source to provide the supply carbons, the substrate including a metal substrate and being metal at an upper surface of the substrate;

performing a second operation that includes removing the unreacted carbon residue from the substrate after suspending the supplying the supply carbons of the first operation; and repeating the first operation and the second operation each at least one time until a desired graphene is formed on the substrate, wherein the desired graphene has Raman intensities indicating a D-band, G-band, and a 2D-band that are graphene characteristics in Raman spectra measurements.

18. A method of directly growing a carbon material, the method comprising:

performing a first operation that includes forming a carbon layer on a substrate, the substrate including a non-metal substrate and being non-metal at an upper surface of the substrate;

performing a second operation that includes removing carbons that are not directly adsorbed onto the substrate from the carbon layer; and repeating the first operation and the second operation until a desired graphene is formed on the substrate, wherein the first operation includes individually separating carbons from a carbon source to supply carbons onto the substrate.

19. The method of claim 18, wherein the individual carbons are formed by plasma processing a carbon source.

20. The method of claim 19, wherein the carbon source includes at least one of an aliphatic carbon material or an aromatic carbon material.

21. The method of claim 20, wherein the first operation and the second operation are performed in a chamber, and the chamber is maintained at a pressure that is less than atmospheric pressure.

22. The method of claim 21, wherein the substrate is maintained at a temperature in a range of about 200° C. to about 700° C. during the performing the first operation and the performing the second operation.

23. The method of claim 22, wherein the desired graphene has Raman intensities indicating a D-band, G-band, and a 2D band are graphene characteristics in Raman spectra measurements, and the non-metal substrate is a silicon substrate, a germanium substrate, or a dielectric substrate.

* * * * *